United States Patent [19]
Yarborough, Jr.

[11] 4,456,884
[45] Jun. 26, 1984

[54] PHASE-LOCK LOOP AND MILLER DECODER EMPLOYING THE SAME

[75] Inventor: John M. Yarborough, Jr., Palo Alto, Calif.

[73] Assignee: SRI International, Menlo Park, Calif.

[21] Appl. No.: 321,542

[22] Filed: Nov. 16, 1981

[51] Int. Cl.³ ................. H03K 13/24; H03L 7/18
[52] U.S. Cl. ........................ 329/50; 329/106; 329/107; 329/122; 331/1 A; 331/25; 360/40; 375/110; 375/111
[58] Field of Search .............. 329/50, 104, 106, 107, 329/122, 124; 331/1 A, 23, 25; 340/347 R, 347 DD; 360/40, 44, 51; 375/86, 87, 110, 111, 120, 23, 94, 81, 95

[56] References Cited

U.S. PATENT DOCUMENTS

| | | | |
|---|---|---|---|
| 4,085,288 | 4/1978 | Viswanathan | 331/1 A X |
| 4,112,383 | 9/1978 | Burgert | 329/50 |
| 4,141,046 | 2/1979 | Brown | 360/51 |
| 4,143,407 | 3/1979 | Liberty | 360/51 |

FOREIGN PATENT DOCUMENTS 102930  8/1980  Japan ........................ 331/25

*Primary Examiner*—Siegfried H. Grimm
*Assistant Examiner*—W. R. Paxman
*Attorney, Agent, or Firm*—Victor R. Beckman

[57] ABSTRACT

A phase-lock loop is disclosed for synchronizing an oscillator signal with a train of input signal pulses, some of which may be missing. The phase-lock loop is of particular use in a decoder for decoding digitally encoded data employing a self-clocking coding scheme. The decoder generates a clock from the input signal stream for use in the decoding process.

27 Claims, 6 Drawing Figures

PHASE-LOCK LOOP AND MILLER DECODER EMPLOYING THE SAME

ORIGIN OF THE INVENTION

The Government has rights to this invention pursuant to Contract Number NO1-NS-3-2322.

BACKGROUND OF THE INVENTION

Digital transmission and recording systems are commonly used in which an analog signal is digitized and encoded using a self clocking code. The encoded signal, without a bit clock, is transmitted over a communications channel and/or is recorded. A decoder converts the signal back to its original digital form, which then may be converted to its original analog form.

Phase-lock loops, as well as decoders for decoding self-clocking coded signals, are well known. However, many phase lock loops are incapable of synchronizing with an input data stream comprising periodic pulses in which one or more pulses are missing between actual pulses. Also, prior art Miller decoders require complicated logic circuit schemes for implementation of the decoding process.

SUMMARY OF THE INVENTION AND OBJECTS

An object of this invention is the provision of an improved phase-lock loop and Miller decoder employing the same which avoid many of the shortcomings and disadvantages of prior art phase-lock loops and Miller decoders.

An object of this invention is the provision of a phase-lock loop which is capable of locking onto and remaining locked onto a periodic input pulse stream having pulses missing from the stream.

An object of this invention is the provision of an improved Miller decoder which is readily implemented to provide for reliable operation.

The above and other objects and advantages of this invention are achieved by means of a phase-lock loop which includes a controlled oscillator and first and second divide-by-N counters driven by the oscillator. A phase detector having inputs from the counters produces an output related to the difference in phase of the counter outputs. The phase detector output is connected to the oscillator through a low pass filter and amplifier for control of the oscillator frequency. The input signal stream is supplied as a reset signal to one of the counters. At lock-on, the counters are clocked at a rate such that reset signals occur at integral counter cycles. For operation at the desired harmonic frequency, gates are included in the connection of the counter outputs to the phase detector for inhibiting the output from one, or the other, of the counters from reaching the phase detector input to provide a large increase or decrease in the controlled oscillator frequency, as required, for lock-on at the desired harmonic.

A Miller code is characterized as having transitions that occur at one (1), one and one-half (1½) and two (2) time units apart. For operation in a Miller decoder, the phase-lock loop counters are operated at a frequency such that two, three and four counter cycles are provided for the 1, 1½ and 2 time unit widths of the code. The Miller code stream is supplied to an edge detector for production of pulses in response to the rising and falling edges of the code stream, which pulses are employed as reset signals for one of the counters in the phase-lock loop. This one counter drives another counter, or additional counter stages, to allow for counting above the capacity of the other counter in the phase lock loop which is not reset.

Outputs from the one counting means with additional counting capacity are supplied to a counter decoder having first and second outputs when the counting means reach counts indicative of 1½ and 2 time unit widths, respectively, of the Miller code. The 1½ time unit output of the decoder is supplied as a clock input to an output toggle flip-flop to toggle the same, and the 2 time unit output is supplied as a set signal to set the flip-flop which toggles the decoded data to the proper state if the flip-flop is in a reset state. Miller decoded data is obtained from the output of the flip-flop.

Clock pulse information for clocking the data is obtained from a clock logic circuit which is supplied with input signals from the edge detector and from the output flip-flop. The clock logic circuit provides a clock output signal with every transition of the encoded Miller input, and with the falling edge of the decoded Miller output from the output toggle flip-flop.

Underflow and overflow logic circuits are also provided for detecting when periods of less than ½ time unit width and greater than 2½ time unit widths, respectively, occur. Outputs from the underflow and overflow logic circuits remove the appropriate counter output from the input to the phase detector for greatly increasing and decreasing the VCO frequency, respectively, allowing the phase-lock loop to lock-on to the correct harmonic frequency.

The invention, together with other objects and advantages thereof, will be better understood from the following description when considered with the accompanying drawings.

BRIEF DESCRIPTION OF THE DRAWINGS

In the drawings, wherein like reference characters refer to the same parts in the several views.

Figure 1:
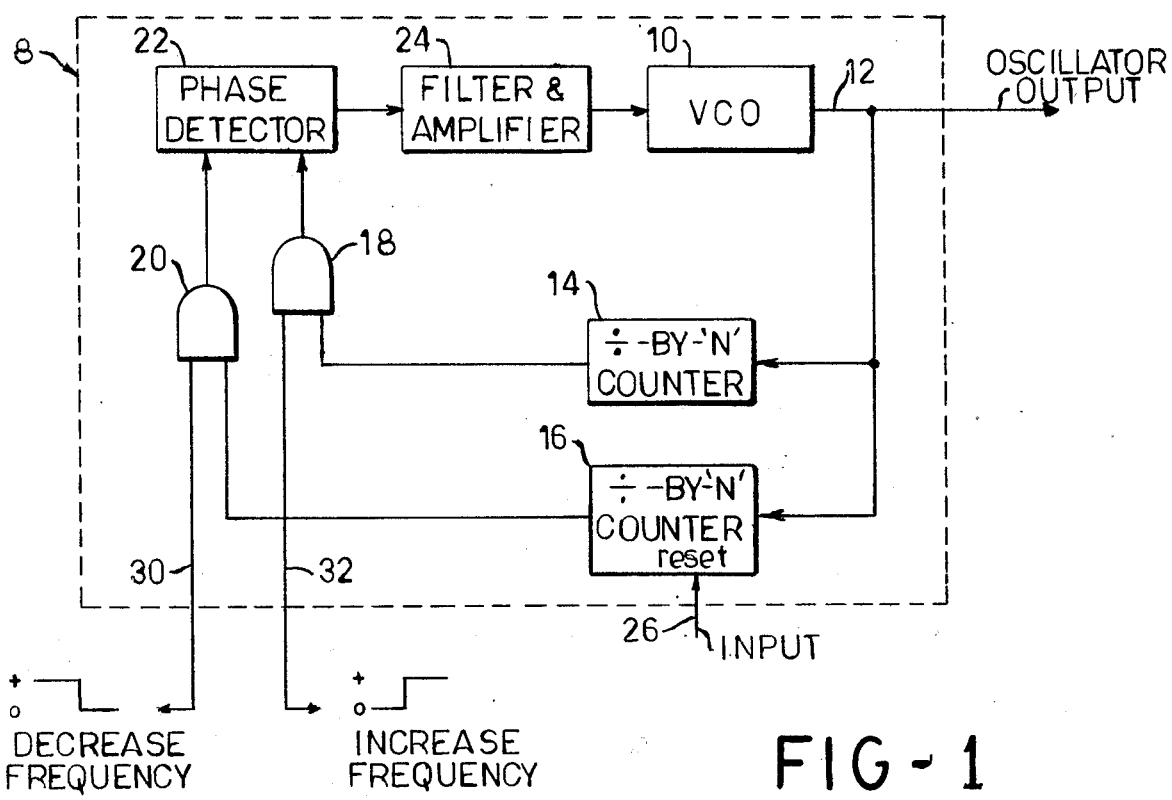
FIG. 1 is a simplified block diagram showing a novel phase-lock loop embodying the present invention.

Reference first is made to FIG. 1 wherein a phase-locked loop circuit 8 embodying the present invention is shown comprised of a voltage controlled oscillator (VCO) 10 having an output at line 12. The oscillator output is supplied to first and second counters 14 and 16 to simultaneously advance the counts thereof. In the illustrated arrangement, divide-by-N counters are employed in which N is the same for both counters. For example, divide-by-64 counters 14 and 16 may be employed, in which case outputs are obtained from the sixth stage of the counters. The counter output stages are connected through control gates 18 and 20, respectively, to the inputs of a phase detector 22, the output from which detector is related to the phase difference in the divide-by-N counter outputs. The phase detector output is connected through a low pass loop filter and amplifier 24 to the controlled oscillator 10 for control of the oscillator frequency to minimize said phase difference. Control gates 18 and 20 normally are conductive when the phase lock loop is locked onto the desired harmonic of the input pulse stream.

Figure 3:
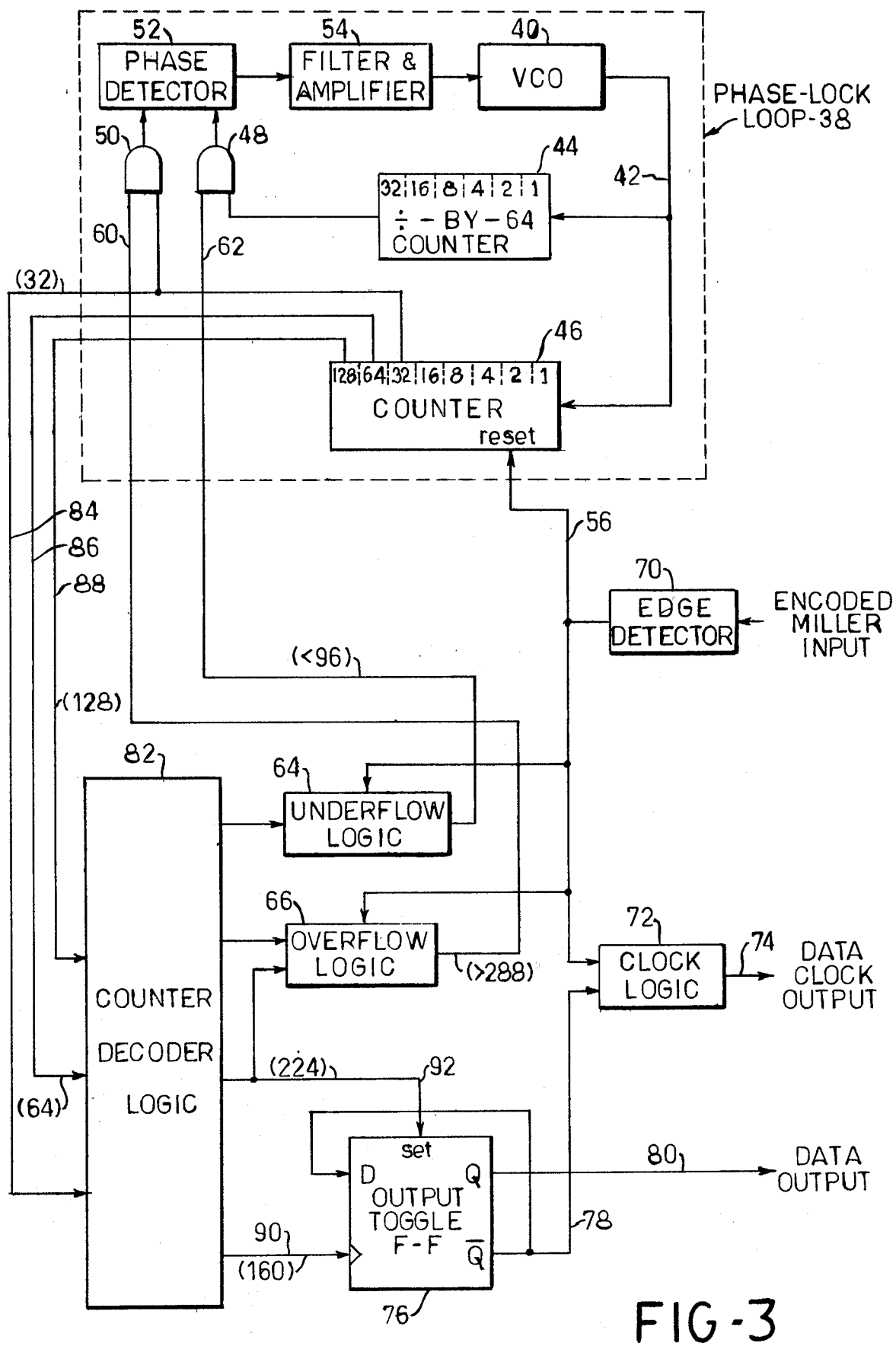
FIG. 3 is a simplified block diagram of a novel Miller decoder employing the phase-lock loop of FIG. 1.

The input signal to the phase-lock loop is supplied to the reset terminal of the second counter 16 over input line 26. When the phase-lock loop is used in a decoder, such as shown in FIG. 3 and described below, the input signals are representative of transitions in the encoded data stream whereby the counter 16 is reset upon receipt of each transition of said digital data input signal.

Figure 2:
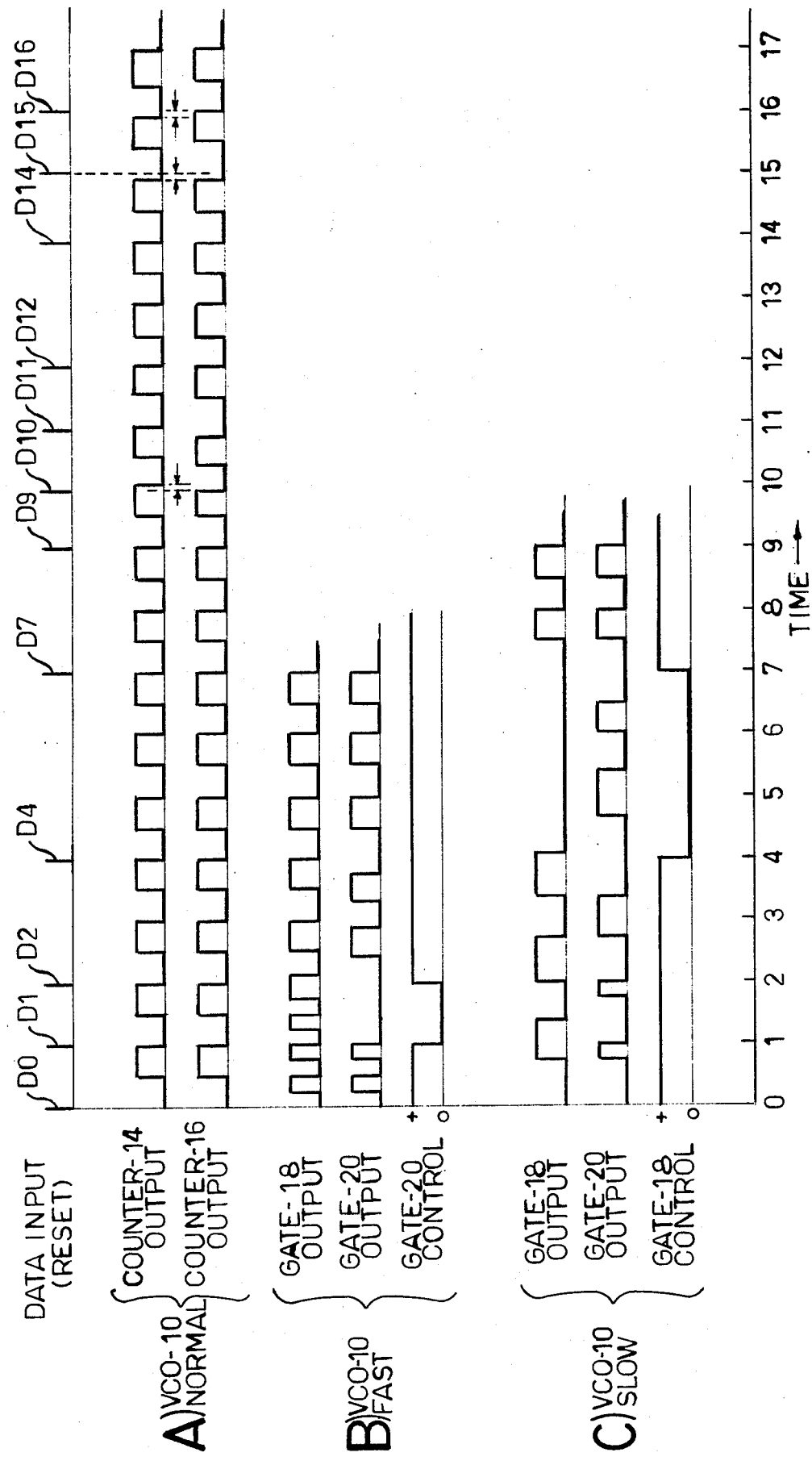
FIG. 2 shows signals appearing at various points of the phase-lock loop shown in FIG. 1 for use in explaining the operation thereof under normal, fast and slow operation of the VCO.

Operations of the phase-lock loop 8 with reference to waveforms shown in FIG. 2 now is provided. Recurrent data input pulses D0, D1, D2, etc. are shown which reset counter 16. The input signal stream comprises, essentially, periodic pulses in which some pulses may be missing without adversely affecting operation of the phase-lock loop and, for purposes of explanation, input pulses D3, D5, D6, D8 and D13 are shown missing from the illustrated input pulse stream. During normal operation, shown at A of FIG. 2, the counter outputs to the phase detector are in phase and occur at a frequency equal to the pulse repetition frequency of the input signal stream. When locked to the input stream, the phase-lock loop counters 14 and 16 simultaneously reach a count of N every period of the pulse input stream. Consequently, application of a reset pulse to counter 16 at the count of N has no affect upon the operation of the phase-lock loop.

It will be noted that missing pulses in the input data stream have no affect on the phase-lock loop operation since the counts return to zero, without resetting, when the counters reach a count of N. As seen in FIG. 2, the missing data input pulses (D3, D5, D6, D8 and D13) do not result in loss of phase lock-on. In the decoder illustrated in FIG. 3, advantage is made of this characteristic of the phase-lock loop operation.

In the example of operation illustrated in FIG. 2, input pulse D10 is received before counters 14 and 16 reach the count of N, whereupon counter 16 is reset by input pulse D10 prior to time 10. This illustrates a phase change in the input data stream and results in a pulse output from counter 16 which now leads that of the output from counter 14 whereupon an error signal is produced at the output of the phase detector 22 which is supplied to the voltage controlled oscillator 10 through the filter and amplifier 24 to increase the oscillator frequency. The increase in oscillator frequency reduces the phase difference in the divide-by-N counter outputs until the two counters again are operating in phase. Similarly, if the reset input signal pulse is late arriving, such as input pulse D15 of FIG. 2, the output from the counter 16 will lag that of the output from the counter 14 for production of an error signal at the output from the phase detector 22 which functions to decrease the frequency of the oscillator 10. Again, the phase difference in the divide-by-N counter outputs is reduced until the two counters are again operating synchronously.

With the illustrated phase-lock loop, the random phase error is equal to 360°/N. It will be apparent, then, that the divisor N by which the controlled oscillator output is divided, should be sufficiently large to provide the necessary circuit resolution. Note, however, that the larger the value of N employed, the higher the frequency at which the controlled oscillator 10 must operate, placing a limit on the size of N which may be used.

It also will be apparent that the phase-lock loop of this invention is capable of locking onto any of several possible harmonics, or sub-harmonics, of the input pulse stream. In order to force the loop to operate at the desired harmonic frequency, the gates 18 and 20 are controlled to inhibit the output from one, or the other, of the counters from reaching the phase detector input to effect a substantial increase, or decrease, respectively, in the oscillator frequency. At B of FIG. 2, operation of the controlled oscillator 10 at twice the desired frequency is shown such that the counters 14 and 16 are operated at twice the desired frequency. To reduce the oscillator frequency, a gate inhibit signal is supplied to the control terminal of the gate 20 over line 30 to remove the output of counter 16 from the input to the phase detector 22, which control signal is shown to inhibit gate 20 between times 1 and 2. As a result, a large error signal is produced at the output from the phase detector which substantially reduces the oscillator frequency. Obviously, in actual operation, it may be required to inhibit gate 20 a greater number of time periods to provide a sufficient reduction in the oscillator frequency for proper operation.

In FIG. 2C, operation of the oscillator at too low a frequency is shown. To increase the oscillator frequency a gate inhibit signal is supplied to the control terminal of gate 18 over line 32 between times 4 and 7, such that only the output from counter 16 is supplied to the phase detector 22 through gate 20, whereupon the phase detector output is changed to produce a large error signal to substantially increase the oscillator frequency for frequency lock-on at the desired harmonic frequency of the input pulse stream.

Reference now is made to FIG. 3 of the drawings wherein there is shown a novel Miller decoder which includes a phase-lock loop 38 of the same type as phase-lock loop 8 shown in FIG. 1. Phase-lock loop 38 includes a voltage controlled oscillator 40 having an output connected over line 42 to the clock inputs of counters 44 and 46. Outputs from the sixth stage of each of the counters are connected through gates 48 and 50, respectively, to the phase-detector 52. The phase detector output is filtered and amplified at 54 for use as a frequency control signal for the oscillator 40. In the operation of the phase-lock loop 38, the counters 44 and 46 simply function as divide-by-64 counters. The one counter 46 includes a reset input terminal which is supplied with reset signals over line 56. Gate inhibit signals are supplied to the gates 48 and 50 over lines 62 and 60, from underflow and overflow logic circuits 64 and 66, respectively, if the oscillator 40 locks onto an undesired subharmonic or harmonic frequency of the reset input signal.

The encoded Miller input signal is supplied to an edge detector 70 which produces a pulse output for every transition of the input signal. In the Miller code a binary "1" followed by a binary "1", or a binary "0", followed by a binary "0" are both represented by a unit length transition. A binary "1" followed by two binary "0"s, or a binary "0" followed by a binary "1", is represented by a one and one half unit length transition. A binary "1" followed by a binary "0" followed by a binary "1" is represented by a two unit length transition. As noted above, Miller encoded signal level transitions occur 1, 1½ and 2 time units apart. As seen in FIG. 3, the edge detector 70 output also is connected to underflow logic 64, overflow logic 66, and to a clock logic circuit 72. Every input pulse to the clock logic 72 from the edge detector 70 results in a data clock output at line 74 therefrom. Other inputs for the clock logic unit 72 are obtained from the $\overline{Q}$ output of an output toggle flip-flop 76 over line 78. Recovered data output is obtained from the Q output of the flip-flop 76 over line 80. Data clock outputs from the clock logic 72 also are produced in response to the rising edge of output pulses from the $\overline{Q}$ output of the flip-flop 76.

Counter 46 in the phase-lock loop 38 is seen to include two more counter stages than counter 44. The output from the sixth counter stage, together with outputs from the added seventh and eighth stages, are supplied to counter decoder logic circuit 82 over lines 84, 86 and 88, respectively. Decimal values represented by output signals at the counter output lines 84, 86 and 88 are shown in parentheses in the drawings.

A signal is produced at output line 90 of the counter decoder logic 82 when counter 46 reaches a count of 160 to toggle the output flip-flop 76. When the counter 46 reaches a count of 224, an output is produced at line 92 of the counter decoder logic for setting the output flip-flop 76, if it is in a reset state. As noted above, a transition of the flip-flop 76 from the set to the reset state also results in the production of a data clock output from clock logic 72.

The lowest frequency of operation of the phase-lock loop 38 is provided when the output of the divide-by-64 counter 44 has two full cycles for the Miller code's unit width, three cycles for a width of 1½, and four cycles for the case where the transitions occur 2 unit widths apart. For these code widths of 1, 1½ and 2, the counter 46 reaches counts of 128, 192 and 256, respectively. As noted above in the description of the phase-lock loop, the phase-lock loop is capable of locking onto a periodic pulse stream even though pulses are missing from the stream. In use as a Miller decoder, one, two or three pulses are missing between successive pulses. As will become apparent hereinbelow, a counter 46 output of $\geq 96$ and $<160$ is used to identify a code width of 1, an output of $\geq 160$ and $<224$ identifies a code width of 1½, and an output of $\geq 224$ and $<288$ identifies a code width of 2.

If counter 46 reaches a count of less than 96 between successive reset pulses, operation of the VCO 40 at too low a frequency is indicated. The underflow logic 64 responds to such a low count, producing a zero level signal at the output line 62 thereof to inhibit gate 48 and subsequently, increase the oscillator frequency. Similarly, if counter 46 reaches a count of greater than 288 between successive reset pulses, operation of the VCO 40 at too high a frequency is indicated, in which case the overflow logic 66 produces a zero level signal at output line 60 thereof which serves to inhibit gate 50 in the phase-lock loop, thereby decreasing the oscillator frequency.

Figure 4:
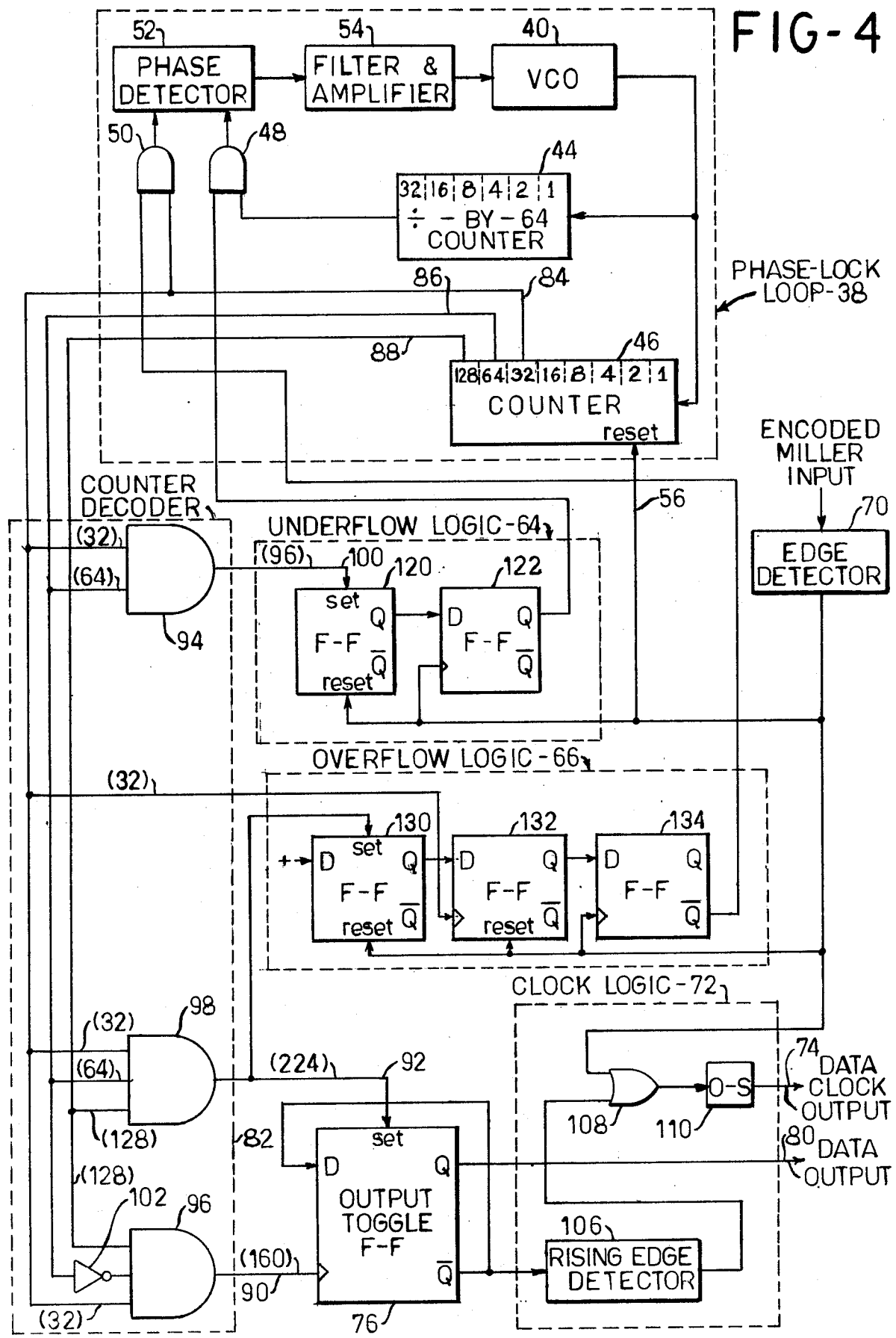
FIG. 4 is a block diagram showing the Miller decoder of FIG. 3 in greater detail.

Details of the underflow logic 64, overflow logic 66, clock logic 72 and counter decoder 82 are provided in FIG. 4, to which figure reference now is made. The counter decoder logic 82 is shown to include three AND gates 94, 96 and 98. The (32) and (64) counter output lines 84 and 86 are supplied as inputs to gate 94 whereby the gate output at line 100 goes from a low to a high state at the count of 96. This output is used to set a flip-flop included in the underflow logic 64, as described below.

All three counter output lines 84, 86 and 88 are connected to inputs of AND gate 96; with the one line 86 being connected thereto through a NOT gate 102. Consequently, the output from AND gate 96 goes high at the count of 160. As noted above, this signal is supplied over line 90 to the clock input of output flip-flop 76 to toggle the same. Finally, the inputs of AND gate 98 are directly connected to output lines 84, 86 and 88 of the counter 46 whereby the gate output, at line 92, goes high at the count of 224. This output sets the output flip-flop 76, if it is in the reset state. This AND gate output also is supplied to a flip-flop included in the overflow logic to set the same, as described in greater detail below.

The clock logic 72, as seen in FIG. 4, includes a rising edge detector 106 responsive to the $\overline{Q}$ output of the output flip-flop 76. The output from the rising edge detector 106 is connected through an OR gate 108 to a one-shot 110 to trigger the same. A second input to the OR gate is provided by the output from edge detector 70. It will be seen, then, that the one-shot 110 is triggered at each transition of the Miller encoded input stream, and whenever the output flip-flop switches from a set to a reset state. The one-shot output at line 74 comprises a data clock signal for clocking data output at line 80.

Figure 5:
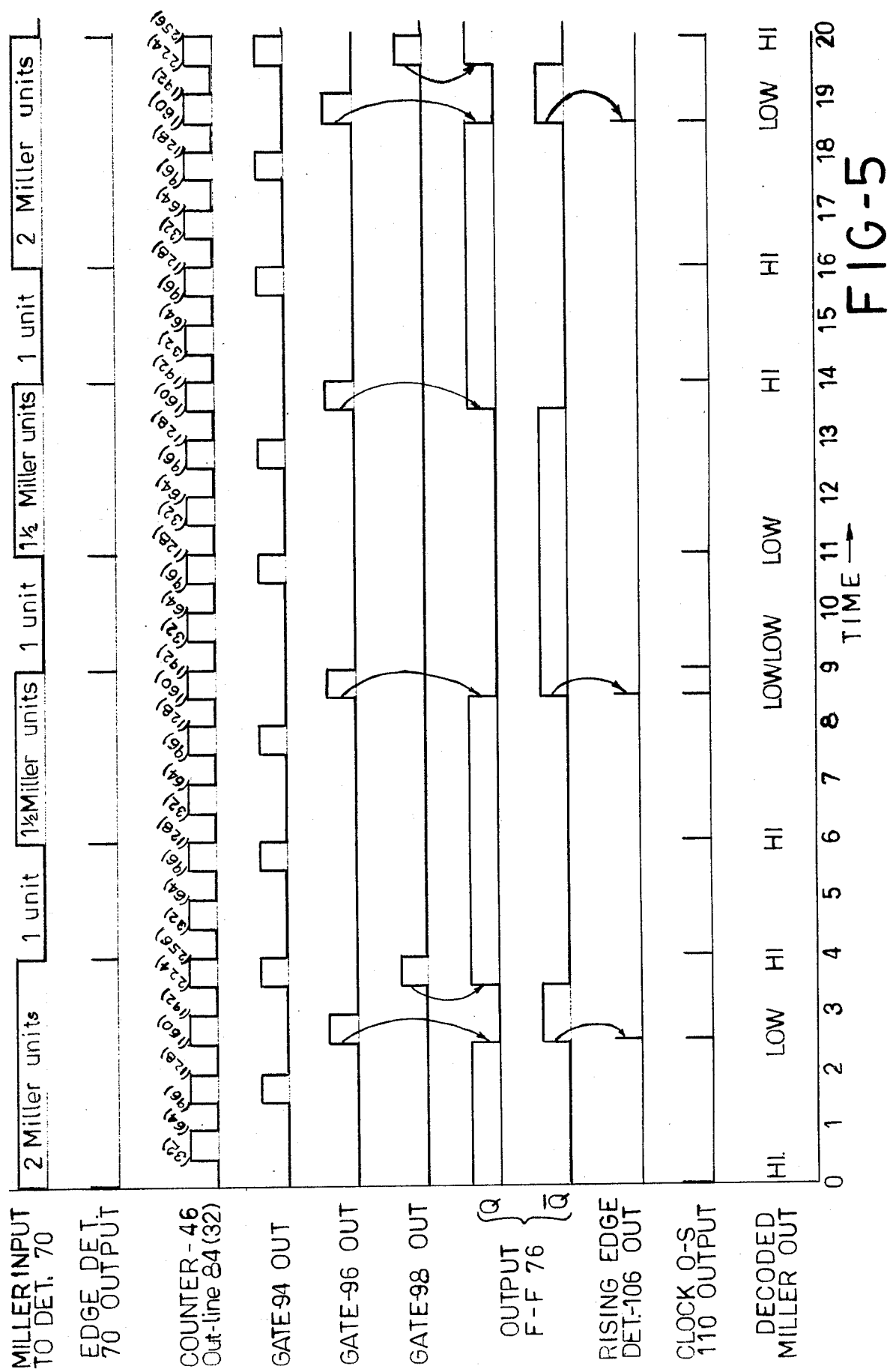
FIGS. 5 and 6 depict signals appearing at various locations of the Miller decoder shown in FIGS. 3 and 4 for use in explaining operation thereof.

Reference now is made to FIG. 5 wherein a Miller encoded input signal to edge detector 70 is shown which includes transitions which occur 1, 1½ and 2 Miller units of time apart. On the time scale shown in FIG. 5, corresponding to that employed in FIG. 2, the 1, 1½ and 2 Miller time units are equivalent to 2, 3, and 4 of the actual time units shown therein. The output from the edge detector 70, at transitions in the Miller code levels, is supplied as a reset signal to the counter 46. In the waveforms of FIG. 5, operation wherein the phase-lock loop is locked in both frequency and phase to the reset signal input thereto is illustrated. Consequently, the reset signals from edge detector 70 occur only at the end of a cycle of operation of the divide-by-64 counter 44 and of the sixth stage of counter 46. It will be apparent, then, that during lock-on, resetting of the counter 46 does not affect operation of the phase-lock loop 38.

The output at line 84 of counter 46 is shown in FIG. 5, together with the count contained in counter 46 at transitions in said output. The 2, 3 and 4 cycles of output at line 84 for the Miller time units of 1, 1½ and 2, respectively, are shown in FIG. 5. The rising edge of the output from gate 96 is shown to toggle the output flip-flop 76 at the count of 160. At the count of 224, which is reached when decoding a Miller interval of two units, the output from gate 98 goes high, which transition sets the output flip-flop 76. When the output flip-flop 76 was toggled, at count 160, the $\overline{Q}$ output went from a low to a high state, which transition triggered rising edge detector 106 for production of an output pulse therefrom. It will be seen then, that during the first input Miller time unit of 2, clock outputs are provided with transitions in the Miller input at counts of 0 and 256, and with a transition in the data output from a "1" state to a "zero" state at the count of 160. The high, low, and high output states of the Q output of flip-flop 76 at line 80 are clocked out at counts of 1, 160, and 256, respectively.

In FIG. 5, the two Miller time unit interval is shown followed by a one Miller time unit interval during which counter 46 reaches a count of 128. During this period, no toggle or reset signal is provided from either gate 96 or gate 98 of the counter decoder 82 whereby the output flip-flop 76 remains in the set condition. At the end of this 1 Miller time unit interval, at time 6, the high at data output line 80 is clocked out by the data clock output produced by the one-shot 110 at this time as a result of the transition in the Miller code input.

During the 1½ Miller time unit interval, between times 6 and 9, an output is produced by gate 96 at the count of 160 by counter 46 which, as described above, toggles the output flip-flop 76. The rising edge of the $\overline{Q}$ output of flip-flop 76 is detected for production of an output from detector 106 which, in turn, triggers the one-shot 110 for production of a clock output at this time. Another clock output is produced at the transition of the Miller input, at the count of 192. Consequently, two low states of the data output are clocked out at, substantially, the counts of 160 and 192 of the counter 46 as a result of this 1½ Miller time unit interval.

Referring again to FIG. 4, the underflow logic unit 64 is shown to include first and second flip-flops 120 and 122, the first of which is adapted to be set by an output at line 100 from gate 94 of counter decoder 82 whenever counter 46 reaches a count of 96. Flip-flop 120 is reset at every transition of the Miller input stream by connection of the reset terminal thereof to the output from edge detector 70. The Q output of flip-flop 120 is connected to the D input terminal of the flip-flop 122, which flip-flop is clocked by the edge detector 70 output. It will be apparent, then, that if the count of 96 is reached by counter 46 before the counter is reset, flip-flop 120 will be set, and the resultant high state at the Q output thereof will be supplied to the D input of flip-flop 122 before flip-flop 122 is clocked. Therefore, when flip-flop is subsequently clocked, the Q output therefrom will be high, to enable gate 48. If flip-flop 122 is clocked before the count of 96, the Q-output will switch to a low state, thereby inhibiting gate 48. In the manner described above, when the output from counter 44 is prevented from reaching the input to the phase detector 52 by inhibiting gate 48, a large error signal is produced at the output thereof to provide a large increase in the frequency of oscillator 40.

Figure 6:
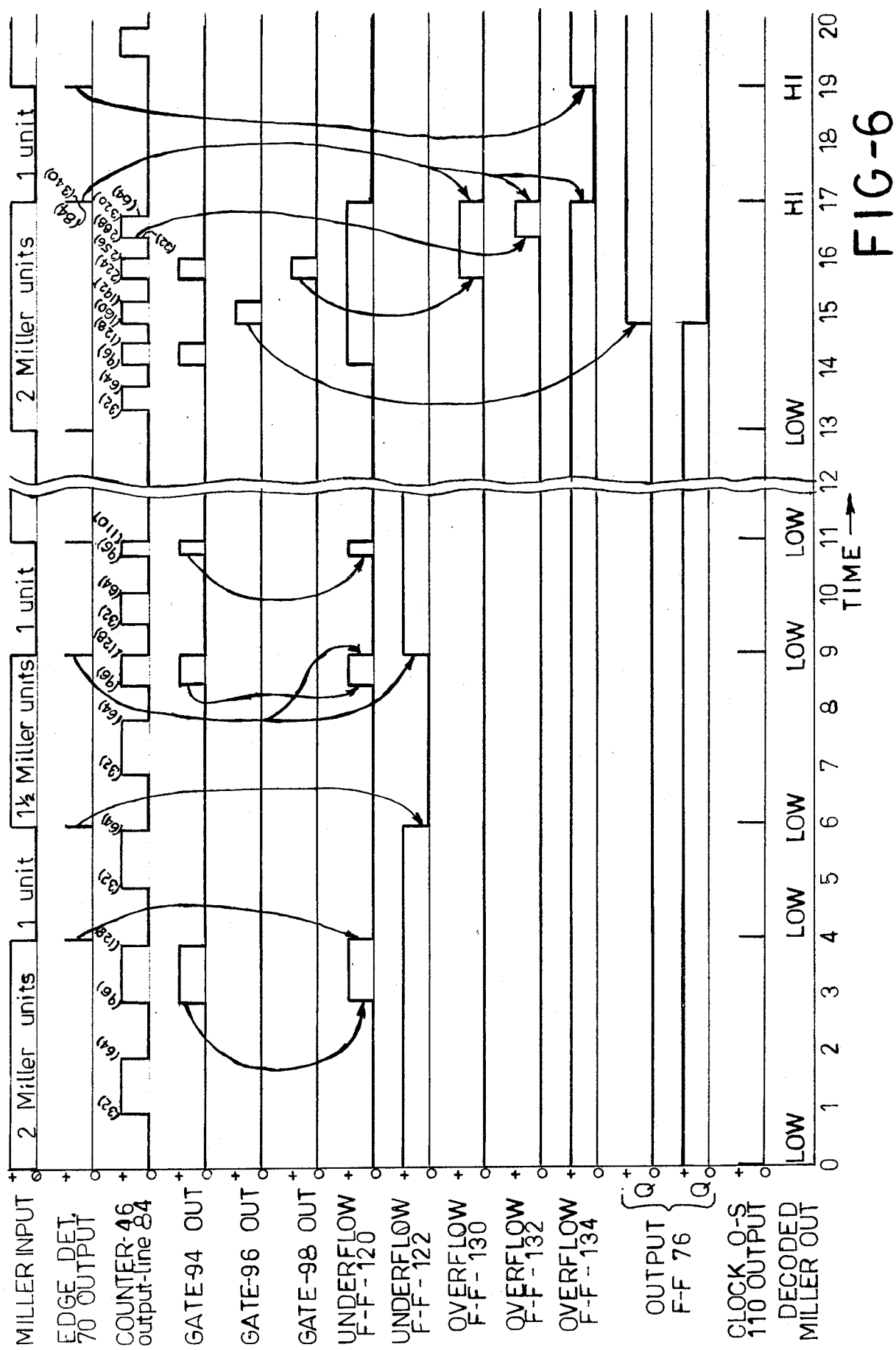

In the waveforms of FIG. 6, to which figure reference now is made, underflow and overflow operating conditions are illustrated. A two Miller time unit interval between times 0 and 4 is shown during which counter 46 reaches a count of only slightly greater than 128. Even though the VCO is operating at too low a frequency for proper lock on to the Miller input transitions, the flip-flop 120 is set at the count of 96 whereby no underflow situation is indicated. During the subsequent one Miller time unit signal, the counter 46 reaches a count of less than 96 before being reset. Consequently, flip-flop 120 is not set before flip-flop 122 is clocked. As a result, the flip-flop 122 Q output goes low when the flip-flop is clocked, thereby inhibiting gate 48. At the next signal output from the edge detector 70, at the end of the illustrated 1½ Miller time unit interval, flip-flop 120 is set and flip-flop 122 is clocked to return the Q output of flip-flop 122 to a high state, thereby reenabling gate 48. While gate 48 is inhibited, the frequency of VCO 40 is increased in the manner described above.

The overflow logic unit 66, illustrated in FIG. 4, includes three interconnected flip-flops 130, 132 and 134, the first of which is set by the output from counter decoder gate 98 when the gate output reaches a count of 224. The following flip-flop 132 is clocked by the rising edge of the counter 46 output at line 84 thereof. Before flip-flop 130 is set at the count of 224, clocking of flip-flop 132 provides a low at the Q output thereof. However, after flip-flop 130 is set, the Q output is switched to a high state at the next clock input pulse, which pulse occurs at the count of 32 (total of 288) from counter 46. If the subsequent Miller transition occurs after said total of 288, flip-flop 134 is clocked by the output from edge detector 70 while the D input thereto is high whereby the $\overline{Q}$ output switches low at said transition, whereupon gate 50 is inhibited. Both flip-flops 130 and 132 are reset by the Miller transitions.

In FIG. 6, operation of VCO 40 at too high a frequency is illustrated, beginning at time 13. The setting of flip-flop 130 by the output from gate 98 at the count of 224 is shown together with the clocking of flip-flop 132 at a count of 32 (i.e. 64 later at a total of 288) and the resetting of flip-flops 130 and 132 and the clocking of flip-flop 134 at the Miller transition at a count of 84 (i.e. 52 later at a total of 340). While the $\overline{Q}$ output of flip-flop 134 is low, gate 50 is inhibited and the frequency of the VCO 40 is decreased in the manner described above.

The invention having been described in detail in accordance with requirements of the Patent Statutes, various changes and modifications will suggest themselves to those skilled in this art. For example, a counter 46 which includes only six stages (the same number of stages as counter 44) may be employed wherein the output from the final stage is connected to the gate 50. The fifth stage of such counter may then be used to drive a three stage counter which also is reset by the Miller transitions, the output from which stages would be supplied to the counter decoder 82 for decoding thereof. Another obvious modification of the Miller decoder involves the use of three counters wherein two are divide-by-N counters such as used in the arrangement of FIG. 1, and the third counter comprises a counter such as counter 46, shown in FIG. 4. The one divide-by-N counter and the larger counter would, of course, be reset by transitions in the Miller input stream. It is intended that the above and other such changes and modifications shall fall within the spirit and scope of the invention as defined in the appended claims.

I claim:

1. A phase-lock loop circuit in which the frequency of a controlled oscillator means is locked to an input signal stream, the phase-lock loop comprising,
    phase detector means having first and second inputs and having an output coupled to the control input of said controlled oscillator means, the first and second inputs thereof coupled to receive the output of said controlled oscillator means through first and second divide-by-N counters, respectively, for producing a control signal at the output thereof representative of the phase difference between the outputs of said divide-by-N counters, and
    means for resetting said second divide-by-N counter in response to the input signal stream.

2. A phase-lock loop circuit as defined in claim 1 wherein said input signal stream comprises substantially periodic input pulses in which some input pulses may be missing without affecting frequency lock-on of the phase-lock loop circuit to said input signal stream.

3. A phase-lock loop circuit as defined in claim 2 wherein groups of input pulses are missing from the input signal stream.

4. A phase-lock loop circuit as defined in claim 2 wherein groups of 1, 2 and 3 input pulses are missing from the input signal stream.

5. A phase-lock loop circuit as defined in claim 4 wherein said input signal stream comprises pulses produced by transitions in a Miller encoded signal.

6. A phase-lock loop circuit as defined in claim 2 wherein the period of said substantially periodic input pulses is an integral multiple of the time required for a complete cycle of operation of said first divide-by-N counter.

7. A phase-lock loop circuit as defined in claim 2 wherein said controlled oscillator is controlled to operate at a frequency of N times the pulse repetition frequency of said substantially periodic input pulses of the input pulse stream.

8. A phase-lock loop circuit as defined in claim 1 wherein said input signal stream comprises substantially periodic input pulses, said phase-lock loop including,
first and second controllable gates connecting outputs from said first and second counters to the respective first and second inputs of said phase detector means for use in inhibiting outputs from said first and second counters from reaching said phase detector means to produce a large increase and decrease, respectively, in the frequency of the controlled oscillator for frequency lock-on to a desired harmonic of the input signal stream.

9. A phase-lock loop circuit as defined in claim 1 including,
counting means for counting output signals from the controlled oscillator means beyond the capacity of said divide-by-N counters, output signals from the phase-lock loop circuit being obtained from said counting means, and
means for resetting said counting means in response to the input signal stream.

10. A phase-lock loop circuit as defined in claim 1 wherein the input signal stream comprises a binary stream of Miller encoded signals, said circuit including edge detector means responsive to the binary input stream for generating pulses in response to transitions in said stream, and
means coupling the output signal from said edge detector means to said second divide-by-N counter for resetting the same.

11. A phase-lock loop which includes a controlled oscillator and first and second divide-by-N counters responsive to the output from said oscillator for counting output pulses of the oscillator, the method of operation comprising,
resetting said second counter in response to an input signal, and
detecting the phase error between outputs from said first and second divide-by-N counters and controlling the oscillator frequency accordingly.

12. A phase-lock loop as defined in claim 11, the method including,
supplying as the input signal a substantially periodic pulse train, and
operating said controlled oscillator at a frequency which is an integral multiple, N, of the pulse repetition frequency of the pulse train.

13. A phase-lock loop as defined in claim 12 using an integral multiple of one.

14. A phase-lock loop as defined in claim 12, the method including temporarily inhibiting the output from said first counter to produce a large increase in frequency of the controlled oscillator whenever the phase-lock loop is locked at a harmonic of the pulse repetition frequency of the pulse train.

15. A phase-lock loop as defined in claim 12, the method including temporarily inhibiting the output from said second counter to produce a large decrease in frequency of the controlled oscillator whenever the phase-lock loop is locked at a subharmonic of the pulse repetition frequency of the pulse train.

16. A Miller decoder for decoding Miller encoded signals having periods between signal transitions of 1, 1½ and 2 time units, the decoder comprising,
means providing a clock signal at a frequency which is a large multiple of the frequency corresponding to a 1 time unit signal,
resettable counter means which is driven by said clock signal.
means for resetting said counter means with said transitions in the Miller encoded signal,
output logic means responsive to outputs from said counter means for producing a binary output which manifests the decoded Miller-encoded signal, and
clock logic means responsive to transitions in the Miller encoded signal and selected transitions in the output from said output logic means for producing a data clock output for clocking the output from said output logic means.

17. A Miller decoder as defined in claim 16 wherein said output logic means comprises,
counter decoder means responsive to outputs from said resettable counter means for producing signals at counter states indicative of 1½ and 2 time unit Miller-encoded signals, and
an output flip-flop responsive to said counter decoder means from which said decoded Miller-encoded signal is obtained.

18. A Miller decoder as defined in claim 17 wherein said output flip-flop is of the toggle type having clock and set terminals to which the signals indicative of 1½ and 2 time unit Miller-encoded signals from said counter decoder means are connected for complementing the flip-flop output level and for changing the output from a first to a second level, respectively.

19. A Miller decoder as defined in claim 18 wherein said clock logic means includes an edge detector responsive to one of the rising and falling edges of an output from said output flip-flop for producing clock pulses in response to said one edge.

20. A Miller decoder as defined in claim 19 wherein a clock output is produced by said edge detector at the falling edge of the decoded Miller-encoded signal from said output flip-flop.

21. A Miller decoder as defined in claim 16 wherein said clock logic means includes edge detector means for producing a clock signal when the decoded Miller encoded signal from the output logic means goes from a high to a low level.

22. A Miller decoder as defined in claim 16 wherein said means providing a clock signal and said resettable counter means are included in a phase-lock loop which also includes,
a divide-by-N counter responsive to said clock signal, phase detector means responsive to outputs from corresponding stages of said resettable counter means and divide-by-N counter, and
means supplying the output from said phase detector means to said means providing a clock signal for control of the clock signal frequency in response thereto.

23. A method of decoding a Miller-encoded data stream made up of signal transitions at 1, 1½ and 2 time unit intervals, said method including, stepping resettable counter means with a clock signal having a frequency which is a large multiple of the frequency corresponding to a time unit interval of the encoded date stream, resetting said counter means at transitions in the encoded data stream, clocking a toggle flip-flop with a first output from the counter means when a count indicative of a 1½ time unit interval is reached, changing the toggle flip-flop output from a first to a second level with a second output of said counter means when a count indicative of a 2 time unit interval is reached, and obtaining decoded data from the output from the toggle flip-flop.

24. A method of decoding as defined in claim 23 wherein said step of changing the toggle flip-flop output comprises setting the same with said second output of said counter means.

25. A method of decoding as defined in claim 23 including producing data clock pulses for the decoded data output from the transitions in the encoded data stream and from the transitions in one direction of the toggle flip-flop output.

26. A method of decoding as defined in claim 23 which includes stepping a divide-by-N counter with said clock signal used for stepping said resettable counter means, supplying outputs from corresponding stages of said resettable counter means and divide-by-N counter to phase detector means for producing an error signal corresponding to the phase difference between said outputs, and controlling the clock signal frequency in response to the error signal from said phase detector means.

27. A method of decoding as defined in claim 26 which includes, controlling the clock signal frequency to provide two cycles of operation of the divide-by-N counter in 1 time unit interval

* * * * *